United States Patent [19]
Imai et al.

[11] Patent Number: 6,150,202
[45] Date of Patent: Nov. 21, 2000

[54] METHOD FOR FABRICATING SEMICONDUCTOR DEVICE

[75] Inventors: Kiyotaka Imai; Hideaki Onishi, both of Tokyo, Japan

[73] Assignee: NEC Corporation, Tokyo, Japan

[21] Appl. No.: 09/090,937

[22] Filed: Jun. 5, 1998

[30] Foreign Application Priority Data

Jun. 5, 1997 [JP] Japan ..................... 9-148016

[51] Int. Cl.⁷ .......................... H01L 21/84; H01L 21/336; H01L 21/8238
[52] U.S. Cl. .......................... 438/154; 438/231; 438/232; 438/527
[58] Field of Search .................................. 438/217, 218, 438/231, 232, 527, 546, 219, 154

[56] References Cited

U.S. PATENT DOCUMENTS

| | | | |
|---|---|---|---|
| 4,613,885 | 9/1986 | Haken | 357/42 |
| 4,956,311 | 9/1990 | Liou et al. | 437/57 |
| 5,543,338 | 8/1996 | Shimoji | 438/151 |
| 5,610,087 | 3/1997 | Hsu et al. | 438/155 |
| 5,654,213 | 8/1997 | Choi et al. | 438/227 |

FOREIGN PATENT DOCUMENTS

| | | |
|---|---|---|
| 60-154660 | 8/1985 | Japan . |
| 4-257267 | 9/1992 | Japan . |
| 5-075041 | 3/1993 | Japan . |
| 5-267600 | 10/1993 | Japan . |
| 6-112483 | 4/1994 | Japan . |

OTHER PUBLICATIONS

Kanaba et al., "A 7 CMOS Technology Utilizing Liquid Phase Selective Oxide Depostition" *IEEE* pp. 25.1.1–25.1.4 (1991).

*Primary Examiner*—Mary Wilczewski
*Assistant Examiner*—David Goodwin
*Attorney, Agent, or Firm*—Foley & Lardner

[57] ABSTRACT

Disclosed is a method for fabricating semiconductor device, which has the steps of: forming a device separation region to section a first device forming region and a second device forming region on a substrate with a SOI structure; forming gate oxide film on the first and second device forming regions; introducing first conductivity type impurity and second conductivity type impurity into the first and second device forming regions to form a channel region of a first channel type transistor by the first conductivity type impurity and to form a source-drain region of the first channel type transistor by the second conductivity type impurity on at least the first device forming region; and introducing the first conductivity type impurity and the second conductivity type impurity selectively into the second device forming region to form a channel region and a source-drain region of a second channel type transistor on the second device forming region.

10 Claims, 8 Drawing Sheets

METHOD FOR FABRICATING SEMICONDUCTOR DEVICE

FIELD OF THE INVENTION

This invention relates to a method for fabricating a semiconductor device, and more particularly to, a method for fabricating an insulated-gate field-effect transistor.

BACKGROUND OF THE INVENTION

In photolithography process, a finer mask pattern and a high-precision positioning have been desired increasingly. Because of this, a high-performance stepper to transfer a pattern to a wafer has been developed, and therefore the price of stepper is increased. Also, the price of a high-precision mask required with this is increased. Under the circumstances, to reduce the number of masks used to fabricate LSI is most effective for reducing the manufacturing cost and shortening TAT(turn-around-time).

A conventional standard CMOS fabricating method (hereinafter referred to as 'first prior art') needs eight masks until forming aluminum wiring. In this regard, a CMOS process to reduce the number of masks has been proposed (hereinafter referred to as 'second prior art'). In this method using the counter-doping, the number of masks to fabricate CMOS can be reduced by two as compared with the standard method of the first prior art.

However, in the second prior art, the implantation for forming p-MOS channel region is conducted under the condition that cancels the impurity profile of the n-MOS channel region implanted earlier. Therefore, the depth of the p-MOS channel region from the surface becomes greater than that of the n-MOS channel region. As a result, the concentration of the channel region is increased at the junction with the source-drain region of the p-MOS transistor, and the junction capacitance is thereby increased.

Furthermore, the $SDBF_2$, implantation for forming the p-MOS source-drain region is conducted under the condition that cancels the impurity profile of SDAs implanted earlier. Therefore, the junction depth of the p-MOS source-drain region is formed to be greater than that of n-MOS. As a result, p-MOS is subject to the short-channel effect more possibly than n-Mos and therefore a fine transistor with a short gate length is difficult to fabricate.

As described above, in the second prior art, though the number of masks is reduced, the p-MOS transistor must have an increased source-drain junction capacitance and a fine structure is difficult to fabricate due to the short-channel effect. Thus, the performance of the p-MOS transistor formed in the second prior art is reduced that formed in the first prior art.

SUMMARY OF THE INVENTION

Accordingly, it is an object of the invention to provide a method for fabricating a CMOS transistor that can be fabricated using the least number of masks while keeping the channel-region junction depths and sour-drain junction depths in both the n-MOS and P-MOS transistors to be equal.

According to the invention, a method for fabricating a semiconductor device, comprises the steps of:

forming a device separation region to section a first device forming region and a second device forming region on a substrate with a SOI structure;

forming gate oxide film on the first and second device forming regions;

introducing first conductivity type impurity and second conductivity type impurity into the first and second device forming regions to form a channel region of a first channel type transistor by the first conductivity type impurity and to form a source-drain region of the first channel type transistor by the second conductivity type impurity on at least the first device forming region; and introducing the first conductivity type impurity and the second conductivity type impurity selectively into the second device forming region to form a channel region and a source-drain region of a second channel type transistor on the second device forming region.

According to another aspect of the invention, a method f or fabricating a semiconductor device, comprises the steps of:

forming a device separation region to section a first device forming region and a second device forming region on a substrate with a SOI structure;

forming gate oxide film on respective parts of the first and second device forming regions;

forming gate electrodes on the gate oxide film of the first and second device forming regions;

introducing first conductivity type impurity into the first and second device forming regions to form a channel region of a first channel type transistor on at least the first device forming region; and introducing second conductivity type impurity into the first and second device forming regions while using the gate electrodes as a mask to form a source-drain region of the first channel type transistor on at least the first device forming region;

introducing the second conductivity type impurity selectively into the second device forming region to form a channel region of a second channel type transistor on the second device forming region; and introducing the second conductivity type impurity selectively into the second device forming region while using the gate electrodes as a mask to form a source-drain region of the second channel type transistor on the second device forming region.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a method for fabricating a semiconductor device in the preferred embodiment, the aforementioned conventional methods for fabricating a CMOS transistor will be explained in FIGS. 1A to 4D.

The process of the first prior art will explained in FIGS. 1A to 2D.

Figure 1A:
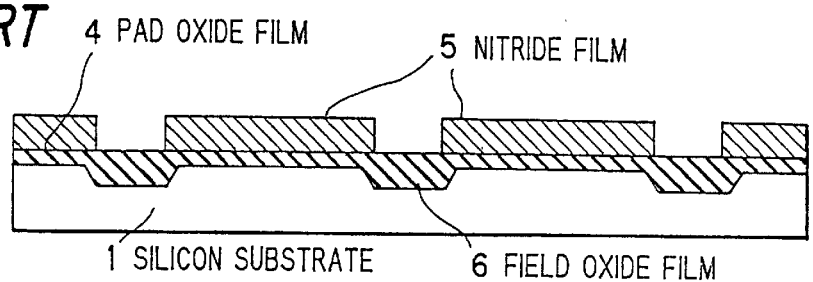
FIGS. 1A to 2D are cross sectional views showing a first conventional method for fabricating a transistor.

As shown in FIG. 1A, pad oxide film 4 and nitride film 5 are grown on a silicon substrate 1, and then the nitride film 5 is patterned by using a first mark, and then field oxide film 6 for device separation is formed by oxidation process.

Figure 1B:
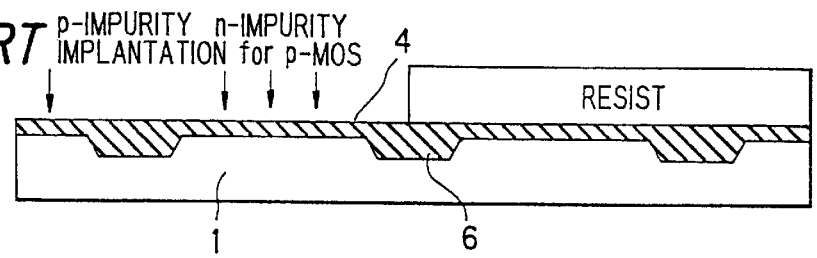

Next, as shown in FIG. 1B, after removing the nitride film 5, p-impurity for forming a n-well region 7 in a p-MOS forming region and n-impurity for forming a p-MOS channel region 8 are implanted by using a second mask.

Figure 1C:
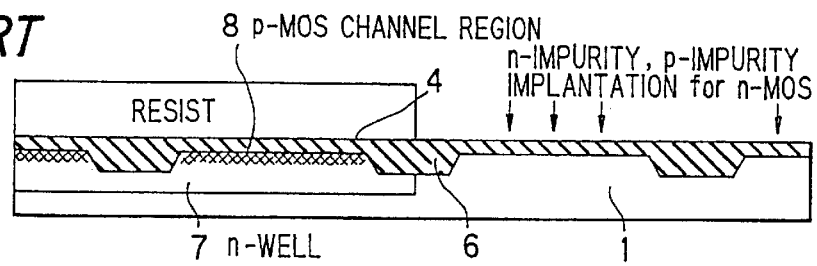

Then, as shown in FIG. 1C, p-impurity for forming a p-well region 9 in a n-MOS forming region and n-impurity for forming an n-MOS channel region 10 are implanted by using a third mask.

Figure 1D:
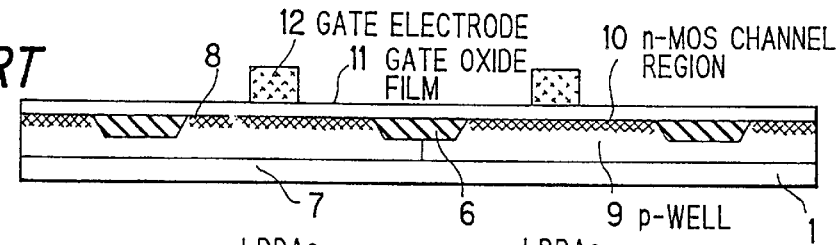

Then, as shown in FIG. 1D, gate oxide film 11 and a polysilicon layer are grown, and then gate electrodes 12 are formed by using a fourth mask.

Figure 1E:
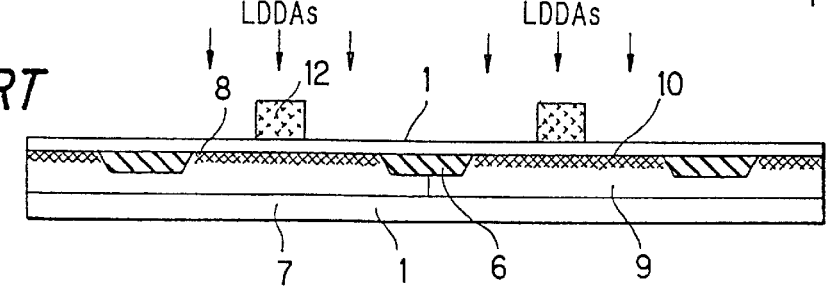

Then, as shown in FIG. 1E, n-i impurity, e.g., arsenic is implanted on the entire surface so as to form a LDC region of n-MOS and a pocket region of P-MOS by one step.

Figure 2A:
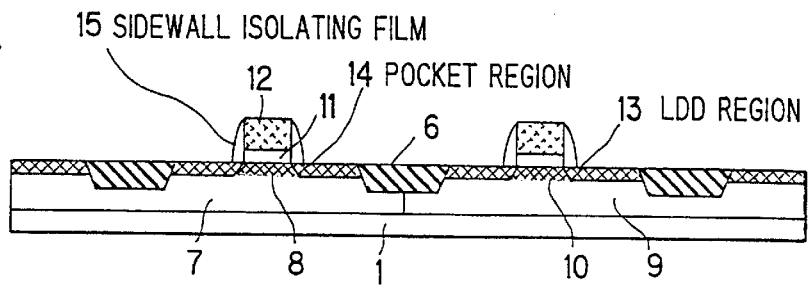

Then, as shown in FIG. 2A, after growing insulating film, such as oxide film or nitride film, isotropic etching is conducted to form sidewall insulating film 15 on the aide wall of the gate electrode 12. Due to the arsenic implantation conducted earlier, a LDD region 13 is formed under the sidewall insulating film 15 of the n-MOS transistor and a pocket region 14 is formed under the sidewall insulating film 15 of the p-MOS transistor.

Figure 2B:
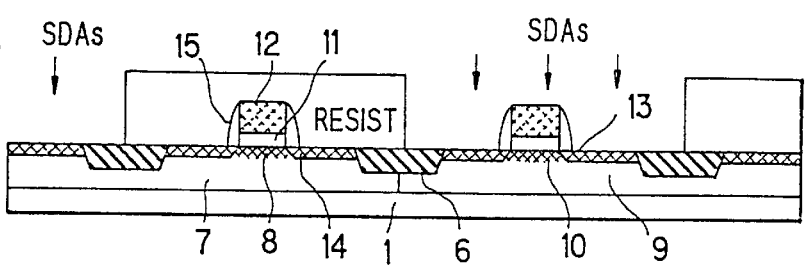

Then, as shown in FIG. 2B, after covering with a fifth mask, n-impurity, e.g., arsenic, is implanted to form a source-drain region 16 of the n-MOS transistor and an n-well contact region 17 for fixing the well potential of the p-MOS transistor.

Figure 2C:
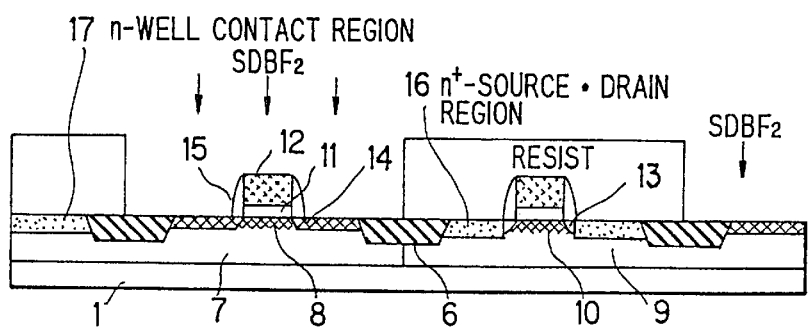

Then, as shown in FIG. 2C, after covering with a sixth mask, p-impurity, e.g., $BF_2$, is implanted to form a source-drain region 18 of the p-MOS transistor and a p-well contact region 19 for fixing the well potential of the n-MOS transistor.

Figure 2D:
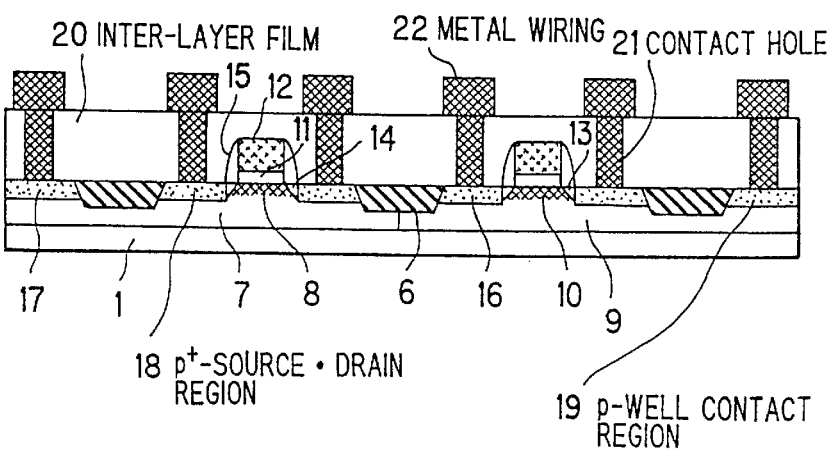

Then, as shown in FIG. 2D, after growing inter-layer film 20, contact holes 21 are formed by using a seventh mask, and further metal wirings 22 are formed by using an eighth mask.

The process of the second prior art will be explained in FIGS. 3A to 4D.

Figure 3A:
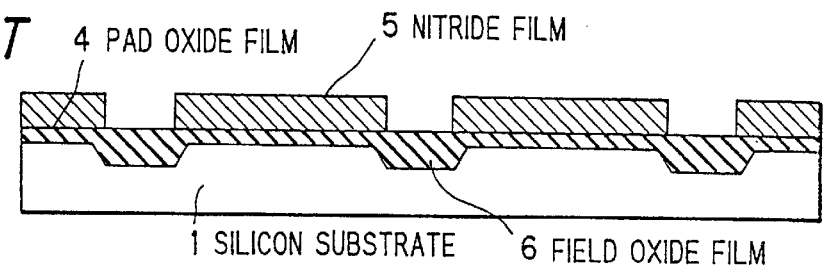
FIGS. 3A to 4D are cross sectional views showing a second conventional method for fabricating a transistor.

As shown in FIG. 3A, pad oxide film 4 and nitride film 5 are grown on a silicon substrate 1, and then the nitride film 5 is patterned by using a first mask, and then field oxide film 6 for device separation is formed by oxidation process.

Figure 3B:
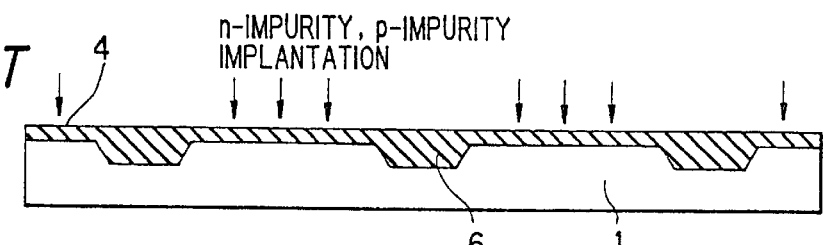

Next, as shown in FIG. 3B, n-impurity for forming a p-well region 9 and p-impurity for forming an n-MOS channel region 10 are implanted on the entire surface.

Figure 3C:
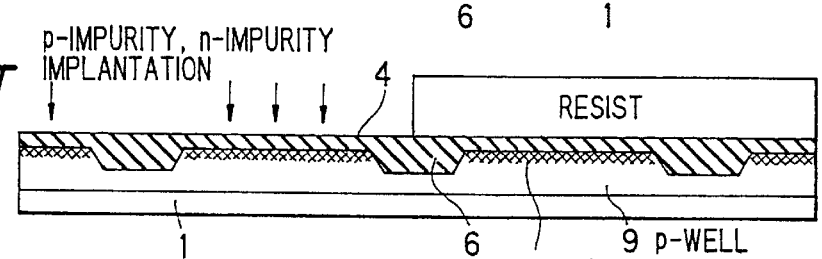

Then, as shown in FIG. 3C, p-impurity for forming a n-well region 7 only in a p-MOS forming region and n-impurity for forming a p-MOS channel region 8 are implanted by using a second mask. In this case, a higher dose of the p-impurity for forming the n-well region 7 is implanted to cancel the impurity profile to form the p-well region 9. Also, a higher dose of the impurity for forming the n-impurity is implanted to cancel the impurity profile of n-gate implantation. Such a method is called a counter-doping.

Figure 3D:
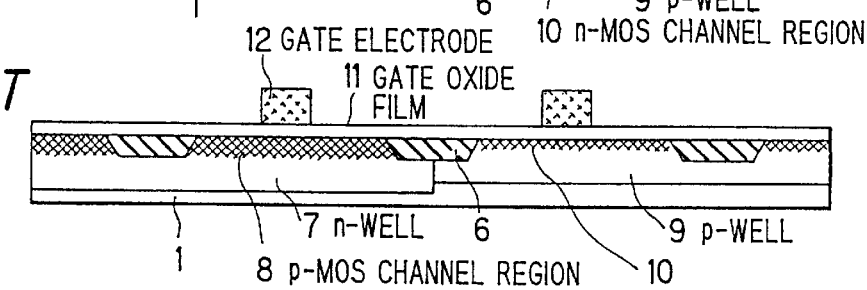

Then, as shown in FIG. 3D, after growing gate oxide film 11 and a polysilicon layer, gate electrodes 12 are formed by using a third mask.

Figure 3E:
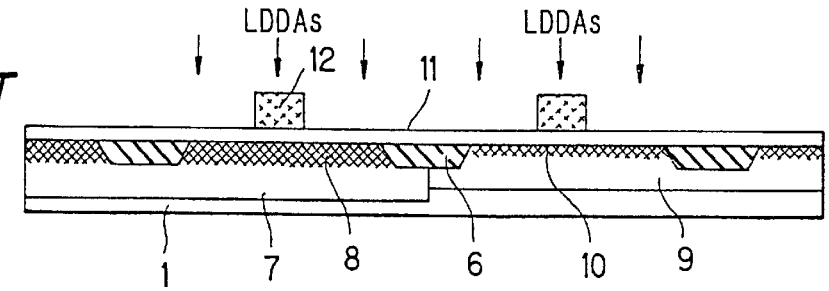

Then, as Shown in FIG. 3E, n-impurity, e.g., arsenic is implanted on the entire surface.

Figure 4A:
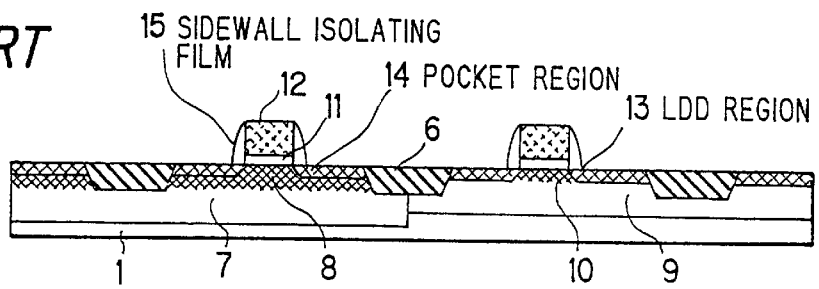

Then, as shown in FIG. 4A, after growing insulating film, such as oxide film or nitride film, isotropic etching is conducted to form sidewall insulating film 15 on the side wall of the gate electrode 12. Due to the arsenic implantation, conducted earlier, a LDD region 13 is formed under the sidewall insulating film 15 of the n-MOS transistor and a pocket region 14 is formed under the sidewall insulating film 15 of the p-MOS transistor.

Figure 4B:
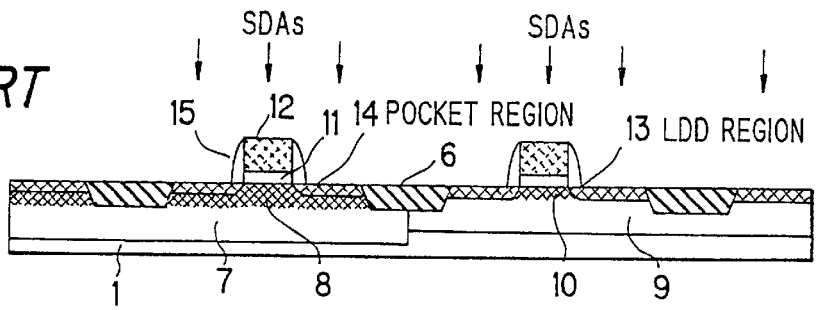

Then, as shown in FIG. 4B, n-impurity, e.g., arsenic (SDAs implantation), is implanted on the entire surface to form a source-drain region 16 of the n-MOS transistor and an n-well contact region 17 for fixing the well potential of the p-MOS transistor.

Figure 4C:
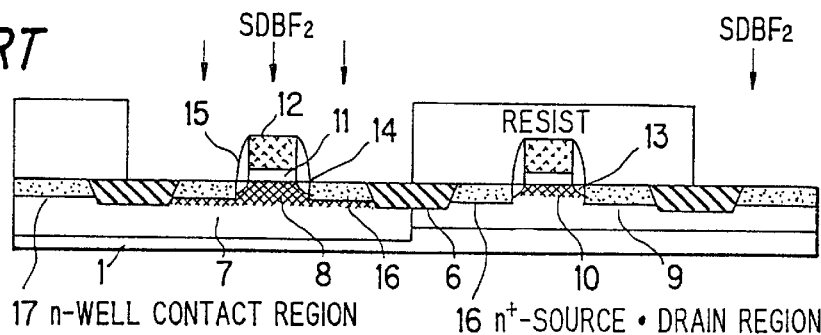

Then, as shown in FIG. 4C, after covering with a fourth mask, p-impurity, e.g., $BF_2$ ($SDBF_2$), is implanted to form a source-drain region 18 of the p-MOS transistor and an n-well contact region 19 for fixing the well potential of the n-MOS transistor. In this case, a higher dose of the $BF_2$ impurity is implanted to cancel the impurity profile of SDAs implantation.

Figure 4D:
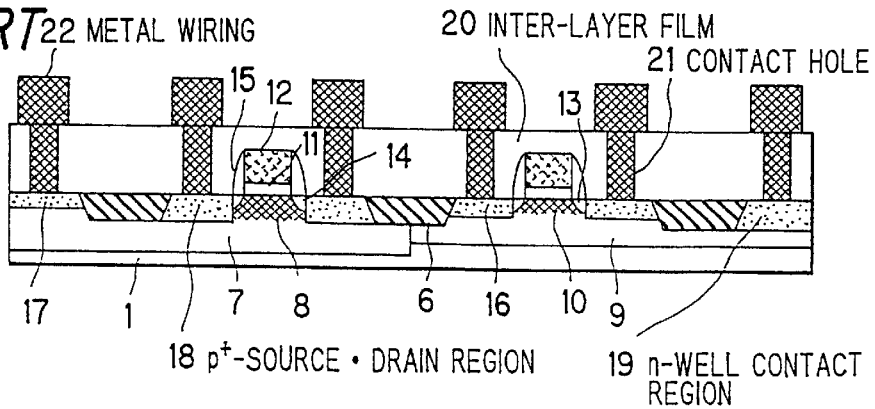

Then, as shown in FIG. 4D, after growing inter-layer film 20, contact holes 21 are formed by using a fifth mask, and further metal wirings 22 are formed by using a sixth mask.

Next, a method for fabricating a semiconductor device in the first preferred embodiment will be explained in FIGS. 5A to 6B.

Figure 5A:
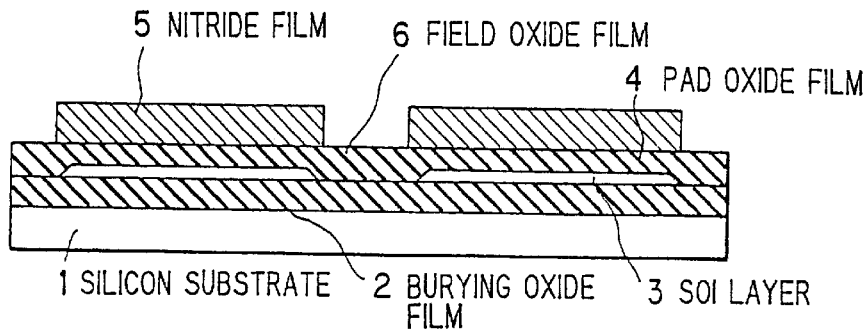
FIGS. 5A to 6B are cross sectional views showing a method for a semiconductor device in a first preferred embodiment according to the invention.

As shown in FIG. 5A, pad oxide film 4 and nitride film 5 are grown on an SOI-structured substrate composed of a silicon substrate 1, burying oxide film 2 and an SOI (silicon on insulator) layer 3, and then the nitride film 5 is patterned by using a first mask, and field oxide film 6 for device separation is formed by oxidation process. Here, the thickness of the SOI layer 3 is 30 to 70 nm. For example, the SOI layer 3 is of bulk silicon. The SOI structure can be formed by using a method that oxygen is injected into a silicon substrate to form the burring oxide film 2, then forming the SOI layer 3 on the surface of the substrate, or the SOI structure can be formed by using a method that oxide film is deposited on a first silicon substrate, then etching the first silicon substrate to form the SOI layer 3, then attaching a second silicon substrate, i.e., silicon substrate 1, onto the oxide film.

Figure 5B:
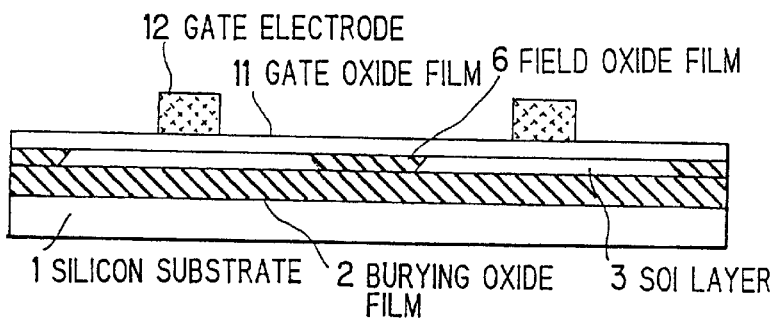

Next, as shown in FIG. 5B, after growing gate oxide film 11 and a polysilicon layer, gate electrodes 12 are formed by using a second mask.

Figure 5C:
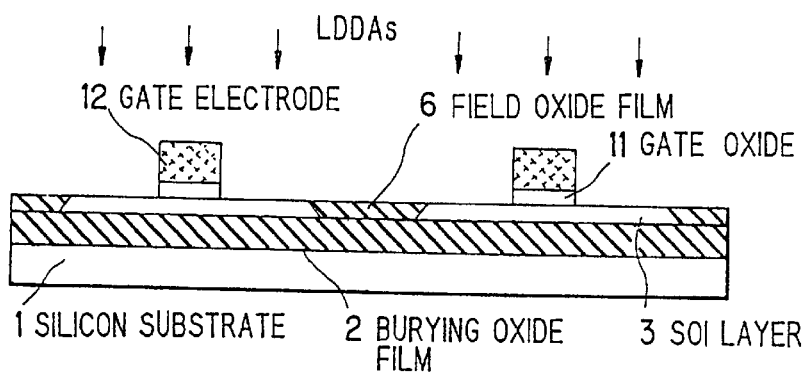

Then, as shown in FIG. 5C, the gate oxide film 11 is etched using the gate electrode 12 as a mask, and then n-impurity, e.g., arsenic, is implanted $1\times10^{13}$ to $1\times10^{14}$ cm$^{-2}$ at 10 to 30 keV on the entire surface while using the gate electrode 12 as a mask.

Figure 5D:
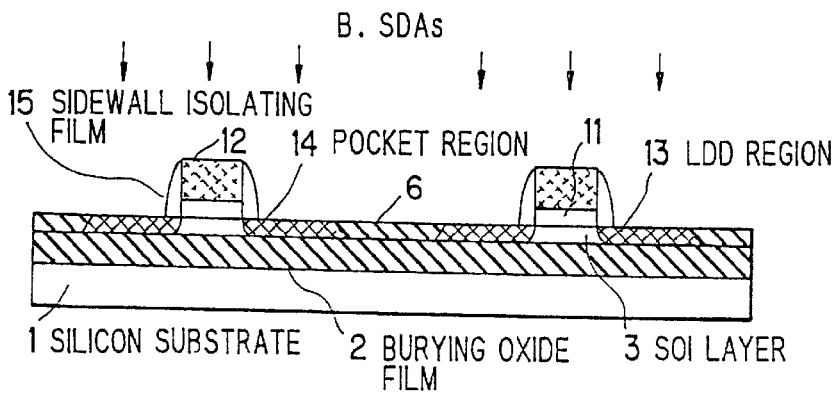

Then, as shown in FIG. 5D, after growing insulating film, such as oxide film or nitride film, isotropic etching is conducted to form sidewall insulating film 15 on the side wall of the gate electrode 12. Due to the arsenic implantation conducted earlier, a LDD region 13 is formed under the sidewall insulating film 15 of the n-MOS transistor and a pocket region 14 is formed under the sidewall insulating film 15 of the p-MOS transistor. The pocket region 14 prevents boron, which is apt to diffuse rather than arsenic, which compose the source-drain region of the transistor, from diffusing into the channel region 8 of the transistor. Thus, the short-channel effect can be suppressed.

Then, p-impurity, e.g., boron, is implanted on the entire surface so that it can reach the entire SOI layer 3 under the gate oxide film 11. By the boron implantation on the entire surface, a channel region 10 of the n-MOS transistor is formed. The implantation energy is determined by the thicknesses of the gate electrode 12, gate oxide film 11 and SOI layer 3. For example, when the gate electrode 12 of polysilicon of 200 nm, the gate oxide film 11 of 6 nm thick and the SOI layer 3 of 50 nm thick are given, it is implanted $2 \times 10^{12}$ to $5 \times 10^{12}$ cm$^{-2}$ at 60 to 80 keV. In this condition, when an inversion layer is formed in the channel region just under the gate oxide film 11 by applying a voltage to the gate electrode 12, a depletion layer extending under the inversion layer reaches up to the burying oxide film 2. A MOS transistor formed on SOI substrate and having such a channel structure that a depletion layer extending under the inversion layer reaches up to the burying oxide film 2 is generally called 'fully depleted MOS transistor'. In this structure, channel region 10 just under the gate electrode 12 is perfectly depleted when operating the transistor and no neutral region exists in the SOI layer 3(channel region 10). Therefore, the body contact for fixing the potential of this region (corresponding to the well contacts 17 and 19 in the case that a conventional bulk substrate is used as shown in the first and second prior arts) is not necessary to form.

Further, n-impurity, e.g., arsenic(SDAS implantation), is implanted on the entire surface to form a source-drain region 16 of the n-MOS transistor. The implantation condition is $1 \times 10^{15}$ to $1.5 \times 10^{15}$ cm$^{-2}$ at 20 to 50 keV. The n-impurity is implanted under the condition that the gate electrode 12 and gate oxide film 11 are used as a mask. Therefore, the impurity cannot be implanted into the n-MOS channel region 10. By this implantation, the gate electrode 12 of the n-MOs transistor is brought to n-type.

Figure 6A:
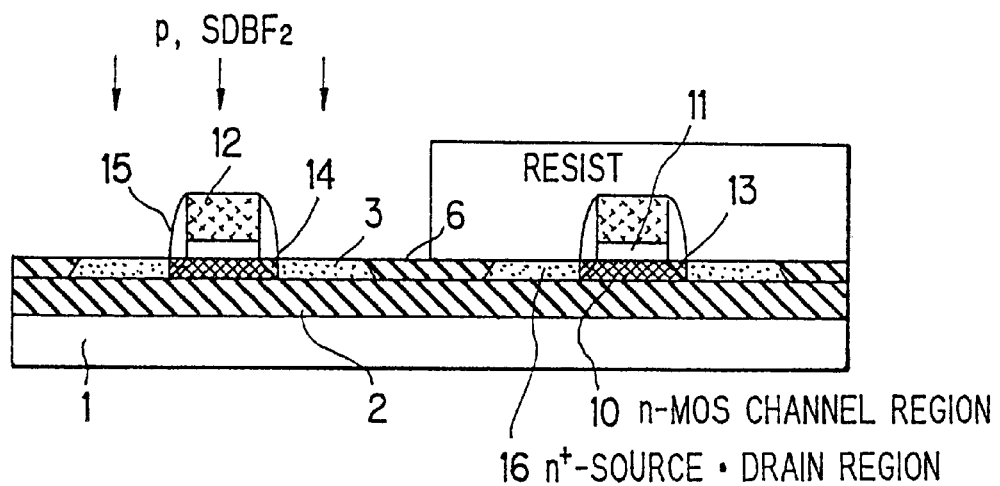

Then, as shown in FIG. 6A, n-impurity, e.g., phosphorus, is implanted into only the p-MOS transistor region to form a p-MOS channel region 8 by using a third mask. When a fully depleted structure is formed like the above-mentioned case of n-MOS with the gate electrode 12, gate oxide film 11 and SOI layer 3, the implantation condition is $3 \times 10^{12}$ to $9 \times 10^{12}$ cm$^{-2}$ (implantation quantity) at 150 to 200 keV (energy). The tail of ion implantation is hidden in the burying oxide film 2, therefore the channel regions of both n-MOS and p-MOS have the same depth to be determined by the thickness of the SOI layer 3.

Then, further to the phosphorus implantation, p-impurity, e.g., BF$^2$ (SDBF$_2$) is implanted to form a source-drain region 18 of the p-MOS transistor. The implantation condition of BF$_2$ is $3 \times 10^{15}$ to $5 \times 10^{15}$ cm$^{-2}$ (implantation quantity) at 30 keV (energy). The p-impurity is implanted under the condition that the gate electrode 12 and gate oxide film 11 are used as a mask. Therefore, BF$_2$ cannot be implanted into the p-MOS channel region 8 of the p-MOS transistor. By this implantation, the gate electrode 12 of the p-MOS transistor is brought to p-type. The tail of ion implantation is hidden in the burying oxide film 2, therefore the source-drain regions of both n-MOS and p-MOS have the same depth to be determined by the thickness of the SOI layer 3.

Figure 6B:
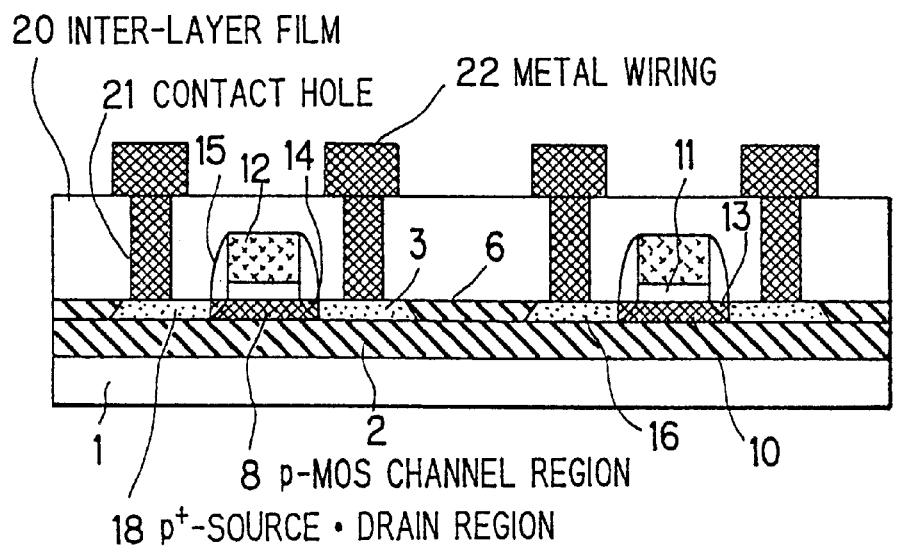

Then, as shown in FIG. 6B, after growing inter-layer film 20, contact holes 21 are formed by using a fourth mask, and further metal wirings 22 are formed by using a fifth mask.

A method for fabricating a semiconductor device in the second preferred embodiment will be explained in FIGS. 7A to 8B.

Figure 7A:
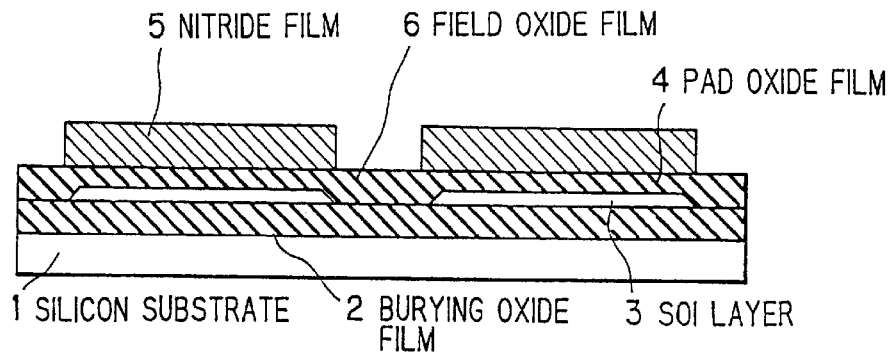
FIGS. 7A to 8B are cross sectional views showing a method for a semiconductor device in a second preferred embodiment according to the invention.
Figure 7B:
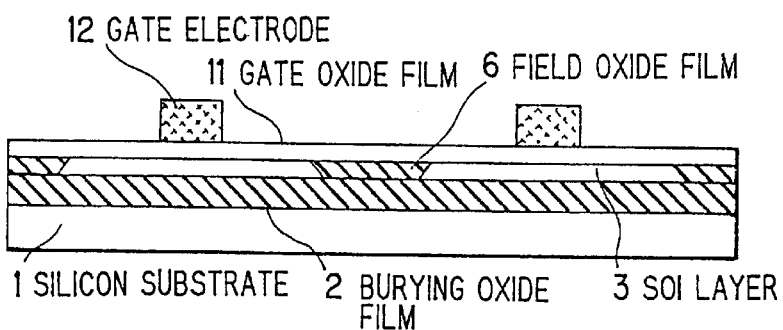
Figure 7C:
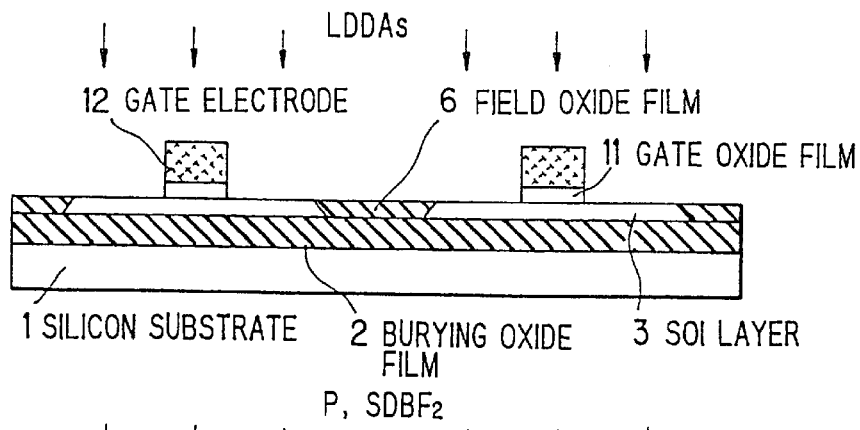

The process in FIGS. 7A to 7C is the same as that in FIGS. 5A to 5c, and therefore the explanations are omitted.

Figure 7D:
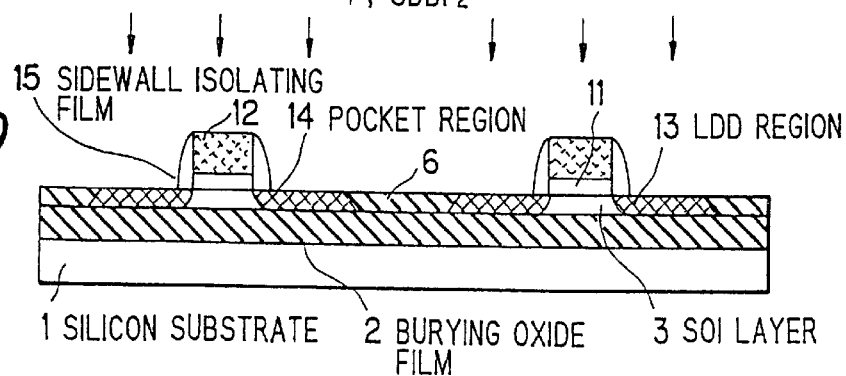

As shown in FIG. 7D, n-impurity, e.g., phosphorus, is implanted on the entire surface so that it can reach the entire SOI layer 3 under the gate oxide film 11. By the phosphorus implantation on the entire surface, the channel region 8 of the p-MOS transistor is formed. The implantation energy is determined by the thicknesses of the gate electrode 12, gate oxide film 11 and SOI layer 3. For example, when the gate electrode 12 of polysilicon of 200 nm, the gate oxide film 11 of 6 nm thick and the SOI layer 3 of 50 nm thick are given, it is implanted $1 \times 10^{12}$ to $3 \times 10^{12}$ cm$^{-2}$ at 150 to 200 keV. In this condition, when an inversion layer is formed in the channel region just under the gate oxide film 11 by applying a voltage to the gate electrode 12, a depletion layer extending under the inversion layer reaches up to the burying oxide film 2.

Further, p-impurity, e.g., BF$_2$, is implanted on the entire surface to form a source-drain region 18 of the p-MOS transistor while using the gate electrode 12 and sidewall insulating film 15 as a mask. The implantation condition is $1 \times 10^{15}$ to $1.5 \times 10^{15}$ cm$^{-2}$ at 15 to 30 keV. Under the condition, BF$_2$ cannot be implanted into the p-MOS channel region 8.

Figure 8A:
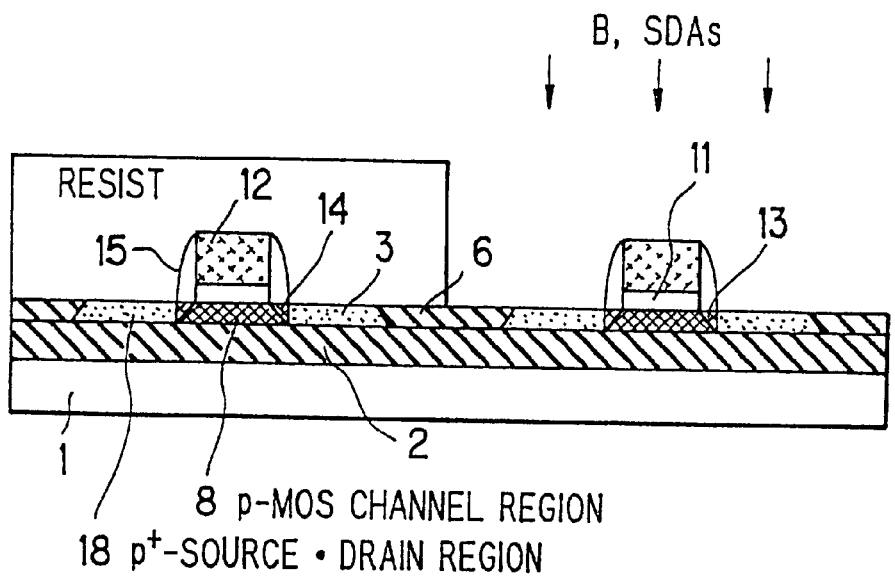

Then, as shown in FIG. 8A, p-impurity, e.g., boron, is implanted into only the n-MOS transistor region to form an n-MOS channel region 10 by using a third mask. When a perfect depletion type structure is formed like the above-mentioned case of n-MOS with the gate electrode 12, gate oxide film 11 and SOI layer 3, the implantation condition is $2 \times 10^{12}$ to $6 \times 10^{12}$ cm$^{-2}$ (implantation quantity) at 20 to 50 keV (energy). The tail of ion implantation is hidden in the burying oxide film 2, therefore the channel regions of both n-MOS and p-MOS have the same depth to be determined by the thickness of the SOI layer 3.

Then, further to the boron implantation, n-impurity, e.g., arsenic (SDAs) is implanted to form a source-drain region 18 of the p-MOS transistor while using the gate electrode 12 and sidewall insulating film 15 as a mask. The implantation condition of As is $3 \times 10^{15}$ to $5 \times 10^{15}$ cm$^{-2}$ (implantation quantity) at 30 keV (energy). The tail of ion implantation is hidden in the burying oxide film 2, therefore the source-drain regions of both n-MOS and p-MOS have the same depth to be determined by the thickness of the SOI layer 3. Under the condition, As cannot be implanted into the channel region of the n-MOS transistor.

Figure 8B:
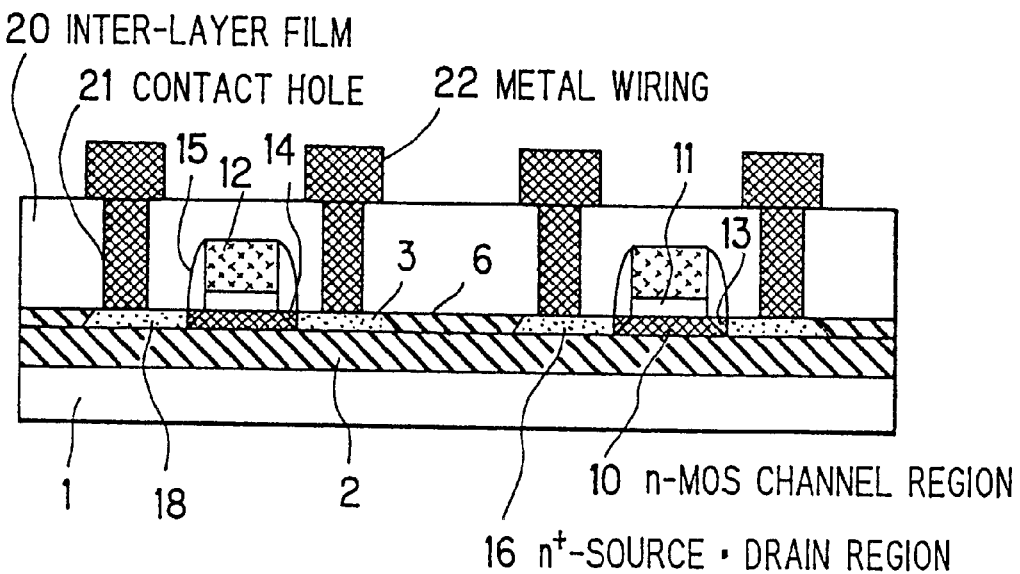

Then, as shown in FIG. 8B, after growing inter-layer film 20, contact holes 21 are formed by using a fourth mask, and further metal wirings 22 are formed by using a fifth mask.

In the first embodiment, the steps until forming the first aluminum wiring can be completed using only the five masks because the p-well and n-well are not necessary to form. Also, the junction depths of the channel regions 10 and 8 of n-MOS and p-MOS and junction depths of the source-drain regions 16 and 18 are determined by the thickness of the SOI layer 3. Therefore, the deterioration of characteristics, which was caused by the deepening of the channel region 8 and source-drain region 18 of p-MOS in the second prior art, does not occur.

In the second embodiment, SDAs is implanted, after implanting SDBF$_2$, on the entire surface. Therefore, the implantation quantity of SDAs can be increased, thereby improving the depletion of the gate electrode of the n-MOS.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating a semiconductor device, comprising the steps of:
   (a) forming a device separation region to section a first device forming region and a second device forming region on a substrate with a silicon on insulator structure;

(b) forming a gate oxide film on said first and second device forming regions;

(c) forming a gate electrode on said gate oxide film for each of said first and second device forming regions, (d) introducing a first conductivity type impurity and a second conductivity type impurity into said first and second device forming regions to form a channel region of a first channel type transistor by said first conductivity type impurity and to form a source-drain region of said first channel type transistor by said second conductivity type impurity on at least said first device forming region; and (e) introducing said first conductivity type impurity and said second conductivity type impurity selectively into said second device forming region to form a channel region and a source-drain region of a second channel type transistor on said second device forming region;

(f) utilizing said gate electrode and said gate oxide film as a mask for at least one of said first and second conductivity type impurities in at least one of said introducing steps (d) and (e).

2. A method for fabricating a semiconductor device, according to claim 1, wherein:

said first conductivity type impurity is of n-type and said second conductivity type impurity is of p-type, and said first channel type transistor is a n-MOS transistor and said second channel type transistor is a p-MOS transistor.

3. A method for fabricating a semiconductor device, according to claim 1, wherein:

said first conductivity type impurity is of p-type and said second conductivity type impurity is of n-type, and said first channel type transistor is a p-MOS transistor and said second channel type transistor is a n-MOS transistor.

4. A method for fabricating a semiconductor device, comprising the steps of:

forming a device separation region to section a first device forming region and a second device forming region on a substrate with a silicon on insulator structure;

forming a gate oxide film on respective parts of said first and second device forming regions;

forming gate electrodes on said gate oxide film of said first and second device forming regions;

introducing a first conductivity type impurity into said first and second device forming regions to form a channel region of a first channel type transistor on at least said first device forming region; and introducing a second conductivity type impurity into said first and second device forming regions while using said gate electrodes as a mask to form a source-drain region of said first channel type transistor on at least said first device forming region;

introducing said second conductivity type impurity selectively into said second device forming region to form a channel region of a second channel type transistor on said second device forming region; and introducing said second conductivity type impurity selectively into said second device forming region while using said gate electrodes as a mask to form a source-drain region of said second channel type transistor on said second device forming region.

5. A method for fabricating a semiconductor device, according to claim 1, wherein:

said first and second channel type transistors are a fully depleted field effect transistor with a silicon on insulator substrate.

6. A method for fabricating a semiconductor device, according to claim 4, wherein:

said first and second channel type transistors are a fully depleted field effect transistor with a silicon on insulator substrate.

7. A method for fabricating a semiconductor device as recited in claim 1, wherein said first and second conductivity type impurities each comprises at least one of phosphorus, boron, and arsenic.

8. A method for fabricating a semiconductor device as recited in claim 4, wherein said first and second conductivity type impurities each comprises at least one of phosphorus, boron, and arsenic.

9. A method as recited in claim 1, further comprising the step of:

forming the source-drain regions symmetrically.

10. A method as recited in claim 4, further comprising the step of:

forming the source-drain regions symmetrically.

* * * * *